United States Patent
Wittenbreder, Jr.

(10) Patent No.: US 6,483,369 B1
(45) Date of Patent: Nov. 19, 2002

(54) COMPOSITE MOSFET CASCODE SWITCHES FOR POWER CONVERTERS

(75) Inventor: Ernest H. Wittenbreder, Jr., Flagstaff, AZ (US)

(73) Assignee: Technical Witts Inc., Flagstaff, AZ (US)

( * ) Notice: Subject to any disclaimer, the term of this patent is extended or adjusted under 35 U.S.C. 154(b) by 0 days.

(21) Appl. No.: 09/970,365

(22) Filed: Oct. 2, 2001

(51) Int. Cl.⁷ .............................................. H03K 17/687
(52) U.S. Cl. ...................................................... 327/427
(58) Field of Search ................................ 323/311, 312, 323/364; 327/98, 374, 375, 376, 427, 434, 436, 493, 581

(56) References Cited

U.S. PATENT DOCUMENTS 5,343,166 A * 8/1994 Pass ............................ 330/264
6,084,391 A * 7/2000 Onodera ...................... 323/315
6,265,929 B1 * 7/2001 Hauser ......................... 327/404

* cited by examiner

Primary Examiner—Matthew Nguyen

(57) ABSTRACT

Composite switches comprising multiple mosfets arranged in cascode which achieve higher efficiency and faster switching are revealed. The gate of a lower mosfet, a low voltage small die size mosfet, is driven with a conventional control circuit for modulation of the composite switch. The upper mosfet, a large die size high voltage mosfet, is controlled at its source terminal by the smaller mosfet while the gate of the upper mosfet is connected to a capacitor whose voltage remains fixed such that no net drive power is required by the gate circuit to drive the upper mosfet. The composite switch simultaneously achieves the low conduction losses of a large die device with the gate drive losses and fast switching of a small die device.

6 Claims, 4 Drawing Sheets

COMPOSITE MOSFET CASCODE SWITCHES FOR POWER CONVERTERS

BACKGROUND OF THE INVENTION

1. Field of the Invention

The subject invention generally pertains to electronic power conversion circuits, and more specifically to high frequency, switched mode power electronic converter circuits.

2. Description of Related Art

The most common device used for high speed switching in high frequency power converters is the power mosfet. For some high power applications bi-polar devices or combination MOS/bipolar devices are used, but these are used at lower switching frequencies due stored charge effects. To achieve the highest power densities mosfets are required because achieving high power densities requires operation at high switching frequencies. Also, at high voltages a soft switching mechanism is often used to eliminate first order switching losses. The zero voltage switching (ZVS) phase shifted full bridge forward converter is a common choice for high power off line applications.

The power mosfet is the best choice for high frequency, high power, and high density applications,:but it is not a perfect switch. The on resistance of the switch is higher than bi-polar devices so that conduction losses may be the dominant loss mechanism, for ZVS applications, and, although the mosfet switch is fast there are still some switching losses. In order to achieve higher efficiencies one can parallel power mosfets or use very large dies which, in both cases, amounts to using more silicon. Using more silicon reduces conduction losses in the switch but also increases switching losses. The switching losses are increased with larger silicon because gate capacitance increases with large silicon and the increased gate capacitance results in both higher gate drive energy and slower switching. The slower switching does not matter so much for the ZVS turn on transition except that the timing of the turn on transition is often critical and faster switching makes the turn on transition timing less critical, but switching losses during the turn off transition depend on switching time. During the turn off transition as the channel turns off the current shifts from the channel of the mosfet to the parallel capacitance. Current in the channel creates losses and current in the parallel capacitance is lossless so that the faster the current in the channel can be transferred to the parallel capacitance the lower the switching losses will be.

OBJECTS AND ADVANTAGES

An object of the subject invention is to provide a composite switch with lower conduction losses than a single mosfet switch or parallel combination of mosfet switches.

Another object of the subject invention is to provide a composite switch with reduced gate drive losses.

Another object of the subject invention is to provide a composite switch with reduced control input capacitance and faster switching.

Further objects and advantages of my invention will become apparent from a consideration of the drawings and ensuing description.

These and other objects of the invention are provided by a novel circuit technique that uses two mosfets arranged in cascode and two capacitors. One of the mosfets is a low voltage device with a small die size and low on resistance, the other mosfet is a higher voltage device with higher on resistance and a larger die. One of the capacitors provides a fixed voltage for driving the high voltage mosfet. The second capacitor is used to limit the voltage applied to the smaller low voltage mosfet.

Figure 1:
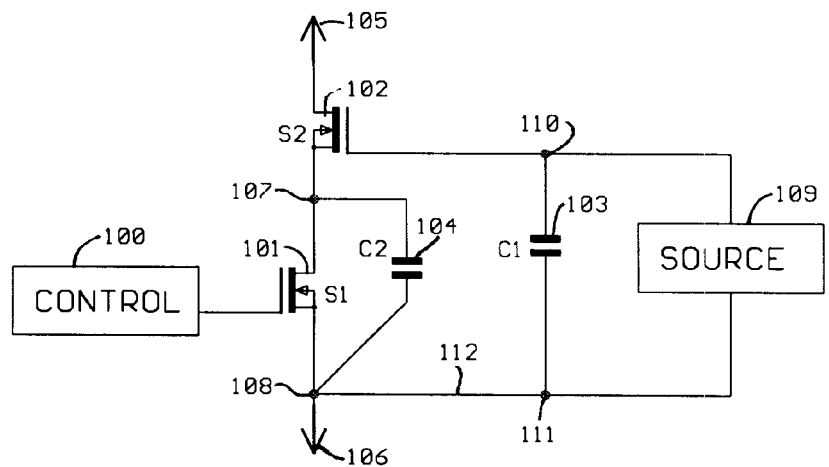
FIG. 1 illustrates a composite switch comprising two mosfets and two capacitors according to the subject invention.

| Reference Numerals | |
|---|---|
| 100 control means | 101 mosfet |
| 102 mosfet | 103 capacitor |
| 104 capacitor | 105 terminal |
| 106 terminal | 107 node |
| 108 node | 109 DC voltage source |
| 110 node | 111 node |
| 112 lead | |

SUMMARY

The subject invention uses a pair of mosfets arranged in cascode and a pair of capacitors to create a composite mosfet switch that simultaneously provides reduced conduction losses, reduced gate drive losses, and faster switching than that obtainable using a single mosfet or a set of parallel mosfets. One of the mosfets is a low voltage mosfet used for controlling a larger mosfet. The gate of the larger mosfet is connected to a first capacitor and is driven on and off at its source by the smaller low voltage mosfet. The first capacitor provides the charge to turn on the larger mosfet and that charge is returned to the capacitor when the larger mosfet is turned off so that no net power is required to drive the larger mosfet. A second capacitor is placed in parallel with the smaller low voltage mosfet to sink charge from the output capacitance of the larger mosfet thereby limiting the drain source voltage applied to the smaller low voltage mosfet to a level within the drain source breakdown range of the smaller mosfet and limiting the gate source voltage of the larger mosfet to a level within the gate source breakdown range of the larger mosfet. The cascode arrangement eliminates the transition plateau of the gate voltage characteristic thereby enhancing the switching speed of the larger mosfet.

A related embodiment is revealed that adds a switch to speed up the switching of the larger mosfet.

DESCRIPTION OF THE PREFERRED EMBODIMENTS

FIG. 1 illustrates the composite cascode mosfet switch of the subject invention. The composite switch can be used in place of a single mosfet switch or in place of a set of parallel mosfet switches to provide operational improvements and greater efficiency.

Referring to FIG. 1, there is shown a composite cascode mosfet switch. The circuit employs a control means for switch timing, two mosfets, and two capacitors. For purposes of the operational state analysis, it is assumed that the C1 capacitor is sufficiently large that the voltage developed across it is approximately constant over a switching interval.

Structure

The structure of the circuit of the subject invention is shown in FIG. 1. Control means 100 is connected to a gate terminal of a mosfet 101. A source terminal of mosfet 101 is connected to a node 108. A drain terminal of mosfet 101 is connected to a node 107. A first terminal of a capacitor 104 is connected to node 107. A second terminal of capacitor 104 is connected to node 108. A source terminal of a mosfet 102 is connected to node 107. A gate terminal of mosfet 102 is connected to a node 110. The node 110 is connected to a first terminal of a capacitor 103. A second terminal of capacitor 103 is connected to a node 111. A lead 112 is connected to node 108 and to node 111. A first terminal of a voltage source 109 is connected to node 110. A second terminal of source 109 is connected to node 111. A first composite switch terminal 106 is connected to node 108. A second composite switch terminal 105 is connected to a drain terminal of mosfet 102.

Operation

It is assumed that the capacitor 103 is large and the voltage on the capacitor 103 is constant.

In operation consider an initial condition in which the control means provides a voltage at the gate of the mosfet 101 that enhances the mosfet 101 so that the mosfet 101 is, effectively, on. With the mosfet 101 on the voltage applied between the gate and the source of the mosfet 102 is equal to the voltage applied to the capacitor 103. Assume that the voltage applied to the capacitor 103 is sufficient to fully enhance the mosfet 102, so that the mosfet 102 is, effectively, on. Assume that a current flows through the two mosfets from the terminal 105 to the terminal 106.

Figure 4:
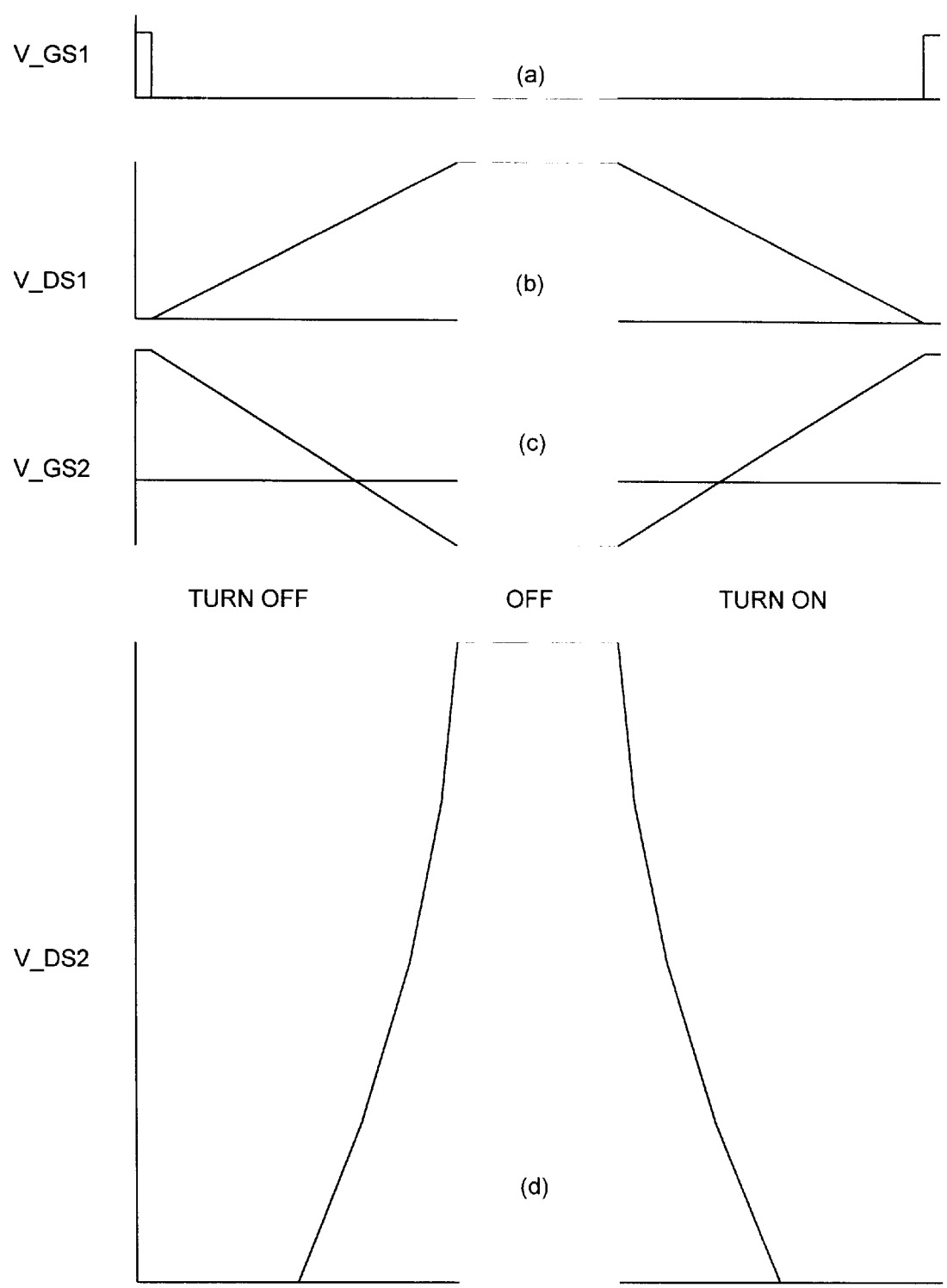
FIG. 4 illustrates voltage wave forms of the FIG. 1 circuit for both turn on and turn off transitions.
Figure 6:
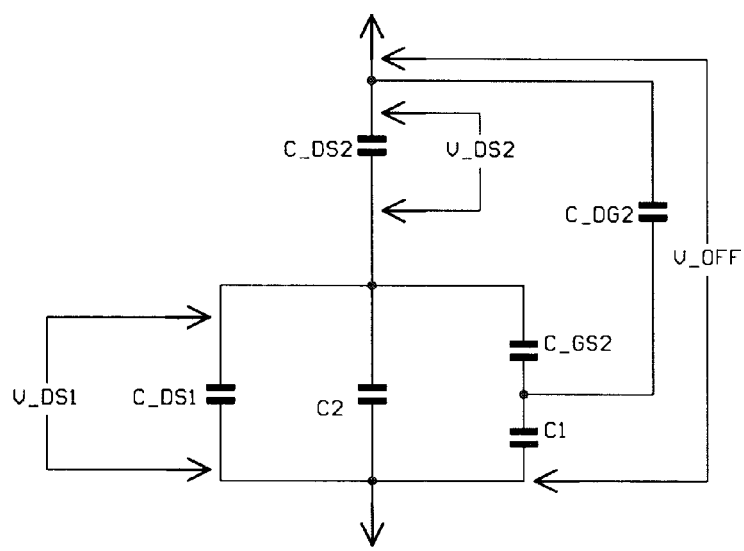
FIG. 6 illustrates the effective circuit of the composite switch when the switch is off.

At a time determined by the control means the voltage applied to the gate of the mosfet 101 is driven to a voltage below the threshold voltage of the mosfet 101 so that the mosfet 101 is, effectively, turned off, as illustrated in FIG. 4(a). At the instant that the gate of mosfet 101 is turned off the current flowing in the mosfet 101 begins to flow in the capacitor 104 and in the gate to source capacitor of the mosfet 102. The current flowing in the capacitor 104 causes the voltage across the capacitor 104, the voltage at the node 107, and the drain to source voltage of the mosfet 101, to rise, as illustrated in FIG. 4(b). At the same time the voltage between the terminals 105 and 106 of the composite switch increases. As the voltage at the node 107 rises the gate to source voltage of the mosfet 102 falls, as illustrated in FIG. 4(c). As the gate to source voltage of the mosfet 102 approaches the threshold voltage of the mosfet 102 the channel resistance of the mosfet 102 increases and the drain to source voltage of the mosfet 102 begins to increase, as illustrated in FIG. 4(d). With the channel of the mosfet 102 off the current in the composite switch now flows in the drain to source capacitance of the mosfet 102 and to a lesser extent it flows in the gate to drain or Miller capacitance of the mosfet 102. The composite switch current component that flows in the drain to source capacitance of the mosfet 102 also flows to the gate to source capacitance of the mosfet 102, to the capacitor 104, to the drain to source capacitor of mosfet 101, and to the capacitor 103. A circuit schematic illustrating the composite switch as a capacitive voltage divider during the off transition is shown in FIG. 6. The gate to source capacitance of the mosfet 102 is much larger than the drain to gate or drain to source capacitance of the mosfet 102 so that the voltage across the drain to source terminals of mosfet 102 rises much faster than the node 107. Since the node 107 voltage continues to rise through the turn off transition there is no plateau voltage for the mosfet 102 during the transition so that the switching time of the mosfet 102 is reduced. There is no plateau voltage because the gate voltage is fixed by the capacitor 103 and the composite switch current forces the node 107 voltage to rise throughout the turn off transition. Also the capacitor 104 contributes to a faster rate of rise of the drain terminal of the mosfet 102 and the composite switch terminal 105 than the node 107, with respect to the node 108 and the composite switch terminal 106. The purpose of the capacitor 104 is to limit the voltage rise of the node 107 and thereby limit the drain to source voltage of the mosfet 101. The gate to source capacitance of the mosfet 102 is effectively in parallel with the capacitor 104 so that a sufficiently large gate to source capacitance of the mosfet 102 can obviate the capacitor 104. Limiting the drain to source voltage of the mosfet 101 enables the use of a low voltage mosfet and a small die for the mosfet 101. The small die of the mosfet 101 will require less drive energy so that gate drive power is low and the channel resistance of the mosfet 101 can be very low since a low voltage mosfet 101 is used, so that the channel resistance of the mosfet 101 does not contribute very significantly to the channel resistance of the composite switch. At the end of the turn off transition, the composite switch current is diverted away from the composite switch by other circuit elements external to the composite switch in a power converter circuit, the composite switch current drops to zero, and the voltage applied to the composite switch remains constant until a turn on transition commences.

During the turn off process the capacitors shown in FIG. 6 are charged. The C1 capacitor 103 is sufficiently large that its voltage remains unchanged. The capacitor 104 is a fixed capacitor but the capacitors associated with the mosfets are all variable and voltage dependent. As the drain to source voltage of the mosfet 102 rises during the off transition its drain to source and drain to gate capacitances drop to near zero and are only very significant at drain to source voltages near zero volts. Typically the gate to drain capacitance is much smaller than the drain to source capacitance and the drain to source capacitance is smaller than the gate to source capacitance. The drain to source capacitance of the mosfet 101 is swamped by the capacitor 104 and the gate to source capacitance of the mosfet 102 except when the drain to source voltage of the mosfet 101 is near zero volts. The gate to source capacitance of the mosfet 102 also changes with voltage but the change is not nearly as significant as with the other two capacitors associated with the mosfet 102. There is still a significant amount of mosfet 102 gate to source capacitance even when the mosfet 102 is fully off. In order to effectively limit the drain to source voltage of the mosfet 101 the sum of the gate to source capacitance of the mosfet 102 and the capacitance of capacitor 104 must be sufficiently large. The gate to source capacitor of the mosfet 102 is effectively in parallel with the capacitor 104 so that it effectively adds to the capacitor 104 for purposes of voltage limiting. If the gate to source capacitance of mosfet 102 is sufficiently large the capacitor 104 is obviated.

During the turn on transition the turn off process is reversed. It is assumed in this discussion that the turn on transition is a zero voltage transition so that the current in the composite switch flows from the terminal 106 to the terminal 105 and is approximately equal in magnitude to the current that flowed in the switch during the turn off transition. During the turn on transition the composite switch current discharges the capacitors until the body diode of the mosfet 102 conducts and,l subsequently, as the voltage at the node 107 continues to fall, the channel of the mosfet 102 turns on as the gate to source voltage of the mosfet 102 falls through the threshold region. When the node 107 voltage reaches the node 108 voltage the body diode of the mosfet 101 begins to conduct and, shortly thereafter, the control means 100 provides a turn on pulse to the gate of the mosfet 101. During the turn on process charge enters the capacitor 103 from the gate of the mosfet 102. The amount of charge entering capacitor 103 during the turn on process is equal to the amount of charge leaving the capacitor 103 during the turn off process so that there is zero net energy expended in driving the mosfet 102 during the entire process. The only gate drive energy expended is for driving the small mosfet 101 so that the small mosfet 101 can be driven quickly and with little energy since it is a small mosfet.

As an example consider a power converter that operates at a frequency, f, of 400 KHz with a duty cycle, D, of 0.2 and an average current, I, of 2.5 amperes using a conventional switch, an IRFS9N60A. The relevant parameters are as follows:

Conventional Switch

R_DS(on)=0.75 ohm, channel on resistance.

Q_G=49 nC @ V_GS=10 volts, the total gate charge is 49 nanocoulombs when the gate drive voltage is 10 volts.

P_C=0.2 I$^2$ R_DS(on) 0.9375 watts, the conduction loss in the channel of the mosfet.

P_G=f Q_G V_GS=0.196 watts, the gate drive power required.

P_T=P_G+P_C=1.13 watts, the sum of the gate drive and conduction losses.

t_on=38 nanoseconds, the turn on time of the mosfet.

t_off=52 nanoseconds, the turn off time of the mosfet.

R_JA=40 C per watt, the junction to ambient thermal resistance.

DT_JA=R_JA P_T=37.5 C, the temperature rise of the mosfet die.

If we form the same power converter but with a composite switch comprising a Si6802DQ as the mosfet 101 and two IRFS9N60A in parallel for the mosfet 102 the relevant parameters are as follows:

Composite Switch

R_DS(on)=0.5 R_DS(on) (IRFS9N60A)+R_DS(on) (Si6802DQ) =0.5 0.75+0.075 ohms=0.45 ohms.

Q_G=9 nanocoulomb @ V_GS=4.5 volts for the Si6802DQ, the net gate charge for the upper switch is zero.

P_C=0.2 I$^2$ R_DS(on)=0.5625 watts, the conduction losses in the composite switch.

P_G=f Q_G V_GS=0.0162 watts, the gate drive losses in the composite switch.

P_IRFS9N60A=0.234 watts each, total losses in each IRFS9N60A.

P_Si6802DQ=0.11 watts., total losses associated with the Si6802DQ, of which 0.0162 watts are dissipated by the gate drive circuit and 0.094 watts are dissipated in the Si6802DQ.

P_T=0.58 watts, total losses for the composite switch.

DT_IRFS9N60A=9.4 C, the temperature rise of a IRFS9N60A.

DT_Si6802DQ=7.8 C, the temperature rise of the Si6802DQ.

t_on=14 nanoseconds, turn on time of the Si6802DQ.

t_off=28 nanoseconds, turn off time of the Si6802DQ.

The comparison shows that the composite switch has both lower channel losses and lower gate drive losses. The rise in die temperatures is also much lower so that the composite switch is much more reliable. The composite switch also switches faster, since the gate circuit drives a much smaller capacitor load and since the switches are arranged cascode, effectively eliminating Miller effect in the switching process. If the original switch had employed two parallel mosfets rather than one mosfet then the switching speed would have been even slower and the gate drive losses even higher for the conventional switch, and, although the channel losses would have been slightly better than the composite switch, still the total losses of the composite switch are significantly lower than the two mosfet parallel combination. The composite switch enables the user to employ a switch in which all performance parameters are improved with no performance trade off. In general, the value added in improved efficiency, reliability, and performance more than offsets the penalty of the additional parts and their costs. Another minor benefit is that the breakdown voltage of the composite switch is slightly greater than the conventional switch, further adding to the reliability of the composite switch by comparison to the conventional switch.

The source 109 provides a source of charge to the capacitor 103 but the power provided by the source 109 after the initial charging of capacitor 103 is negligible.

Related Embodiments

Figure 2:
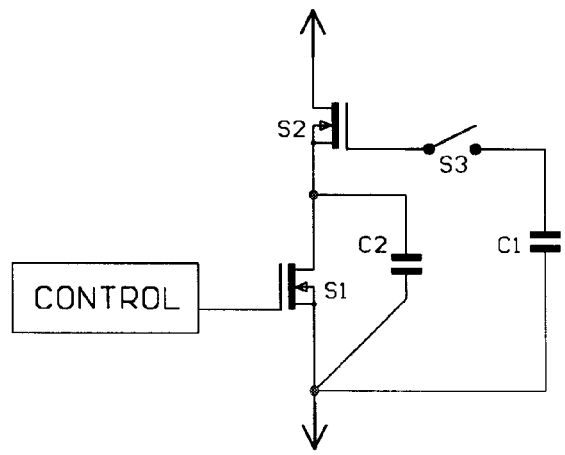
FIG. 2 illustrates another composite switch with an additional speed up switch for improving the switching speed of the composite switch combination according to the subject invention.

FIG. 2 illustrates a composite switch similar to the composite switch of FIG. 1, but with an additional switch, S3, in the gate circuit of the upper mosfet, S2. The switch S3 remains open at all times except briefly during the turn off transition when the source voltage of S2 is positive with respect to the gate voltage of S2 and briefly during the turn on transition at about the same time that the mosfet 101 turns on. The S3 switch guarantees fast transitions for the switch S2. By slightly delaying the transitions of the S2 switch with the S3 switch the switching time of the upper switch S2 is reduced.

Figure 3:
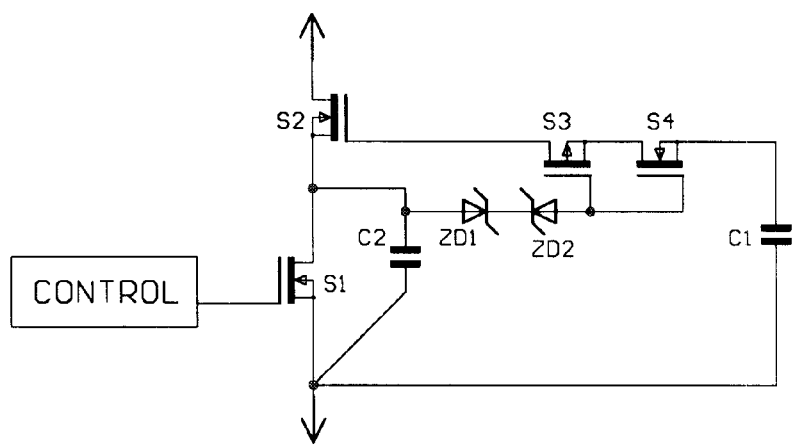
FIG. 3 illustrates the composite switch of FIG. 2 with a specific semiconductor implementation of the speed up switch.

FIG. 3 illustrates a possible semiconductor implementation of the FIG. 2 circuit. During the turn off transition the gate does not discharge into the C1 capacitor until the ZD2 zener diode avalanches and turns on the S4 mosfet. The gate to source capacitor of the S2 mosfet discharges with the composite switch current. During the turn on transition the gate of S2 does not charge up until the ZD1 zener diode avalanches and turns on the S3 switch. The charging current of the S2 switch is limited to the composite switch current.

Figure 7:
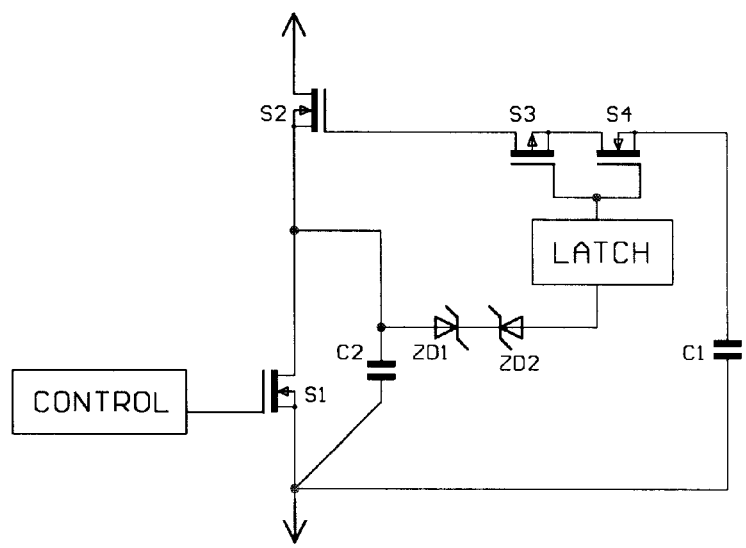
FIG. 7 illustrates the FIG. 3 circuit with a latch added to the speed up circuit.

FIG. 7 illustrates an other implementation of the FIG. 2 circuit in which a latch is added to the FIG. 3 circuit. During the turn off transition in the FIG. 3 circuit when the S4 switch begins to conduct the voltage at the gate of the S2 switch drops and the voltage drop is fed back to the source of the S2 switch through the gate to source capacitance of the S2 switch which feeds the voltage drop to the gate of the S4 switch through the zeners. This is a negative feedback that slows the turn on of the S4 switch, limiting the S2 gate discharge current to the current flowing in the composite switch. The latch circuit changes state when one of the zeners avalanches and forces the S4 switch on hard, regardless of any voltage change at the gate of S2, so that the discharge current of the gate to source capacitor of the S2 switch is not limited by the negative feedback. As a result, when the S4 switch turns on, the source of the S2 switch will drop in voltage. The latch circuit provides a similar service for the S3 switch during the turn on, transition.

Figure 5:
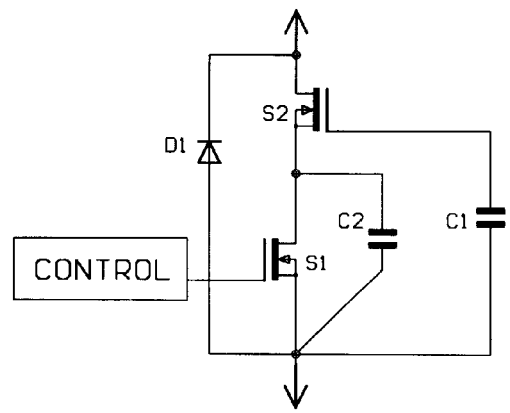
FIG. 5 illustrates the FIG. 1 circuit with an additional fast diode provided to prevent turn on of the slower body diodes of the composite switch.

FIG. 5 illustrates the FIG. 1 circuit with a diode connected in anti-parallel to the composite switch. The anti-parallel diode prevents conduction of the body diode of the lower mosfet by providing a preferable alternate path. The body diode conduction is avoided because the body diode is often slow and its conduction has lead to cross conduction and catastrophic failure in some cases.

Figure 8:
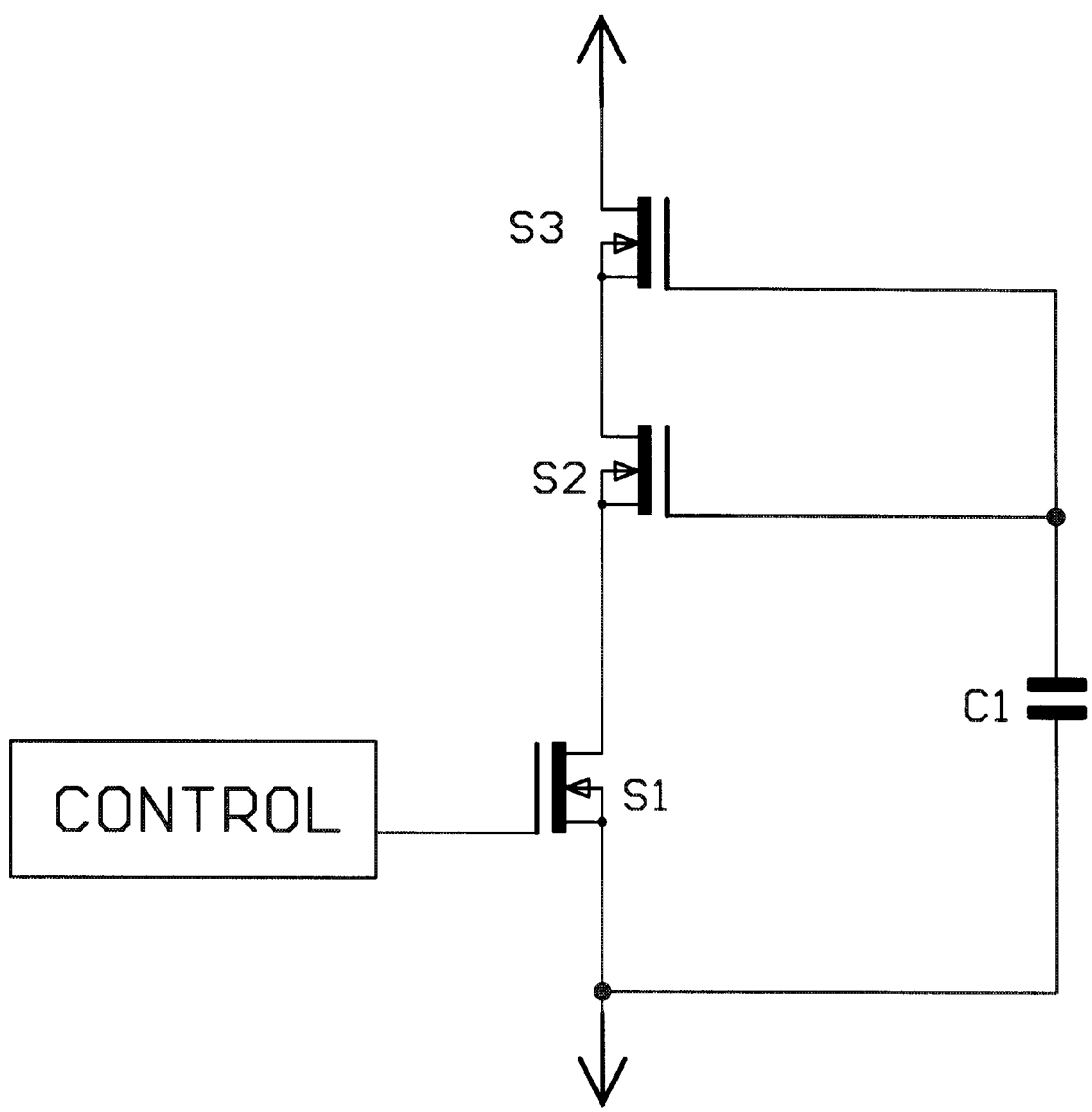
FIG. 8 illustrates a composite switch comprising three mosfets.

FIG. 8 illustrates a three mosfet composite switch that requires only one capacitor. The S2 switch obviates the C2 capacitor. The S1 switch is a low voltage small die size mosfet, the S2 switch is a large die size low voltage mosfet, and the S3 switch is a large die size high voltage mosfet. The purpose served by the C2 capacitor of FIG. 1, which is to limit the drain to source voltage of the S1 switch, is served by the gate to source capacitor of the S2 switch and the gate to source capacitor of the S3 switch. The S2 switch should be chosen with a lower threshold voltage than the S3 switch for maximum effect. The S3 switch will begin to turn off before the S2 switch and while it is turning off the S3 switch current will discharge the gate capacitances of the S2 switch which remain larger while the S2 switch remains on. The channel resistance of the S2 switch should contribute only negligibly to the channel resistance of the composite switch since it is larger than the S1 switch and the same or similar low voltage. The S2 switch also permits the source of the S3 switch to rise to a higher voltage without the risk of breakdown in the S1 switch. The voltage limitation at the source of the S3 switch becomes the gate to source voltage breakdown of the S3 switch. Since the connection arrangement is cascode the Miller effect is eliminated and the switching speed is improved. Also, there is no net power required to drive the S2 and S3 switches. The net effect of the addition of the S2 switch and the elimination of the C2 capacitor from the original circuit is faster switching and a very slight increase in conduction losses. The addition of a switch in series with the C1 capacitor, properly timed, yields even faster switching.

Additional Embodiments

Additional embodiments are realized by adding circuit elements to the basic composite switch. By adding mosfets in parallel to the mosfet 102 new composite switches with the same advantages as the composite switch revealed here are realized. By adding diodes in series with and in anti-parallel to the upper mosfet 102 body diode conduction of the upper mosfet can be prevented with some additional conduction losses.

Conclusion, Ramifications, and Scope of Invention

Thus the reader will see that the composite switch of the invention provides power converter switching means with higher switch performance in every respect. The composite switch provides faster switching by eliminating the Miller effect and by presenting a much smaller capacitor load to the drive circuit of the lower switch. The composite switch provides reduced gate drive losses by providing a mechanism for recovery of the drive energy of the upper mosfet. The composite switch provides lower conduction losses by a combination of a low voltage control mosfet with very low channel resistance and an upper mosfet with a larger die size or a parallel combination of upper mosfets equivalent to a mosfet with a larger die size.

While my above description contains many specificities, these should not be construed as limitations on the scope of the invention, but rather as exemplifications or preferred embodiments thereof. Many other variations are possible. For example, composite switches with additional cascode connected power mosfets using the principles revealed here to form a faster more efficient switch or a composite switch with higher voltage capability, a composite switch that does not require a capacitor in parallel with the mosfet 101, and series or parallel combinations of the composite switches presented here. Accordingly, the scope of the invention should be determined not by the embodiments illustrated, but by the appended claims and their legal equivalents.

I claim:

1. A mosfet composite switch comprising
   a first composite switch terminal,
   a first mosfet having a drain terminal, a gate terminal, and a source terminal with said drain terminal of said first mosfet connected to said first composite switch terminal,
   a second mosfet having a drain terminal, a gate terminal, and a source terminal with said; drain terminal of said second mosfet connected to said source terminal of said first mosfet,
   a second composite switch terminal connected to said source terminal of said second mosfet,
   a first capacitor having first and second terminals with said first terminal of said first capacitor connected to said gate terminal of said first mosfet and with said second terminal of said first capacitor connected to said source terminal of said second mosfet,
   control means connected to said gate terminal of said second mosfet,
   whereby said composite, switch provides a combination of improved switching speed, lower gate drive power, and lower conduction losses than a comparable single mosfet or parallel combination of mosfets.

2. The composite switch of claim 1 further comprising
   a second capacitor having first and second terminals with said first terminal of said second capacitor connected to said source of said first mosfet and with said second terminal of said second capacitor connected to said source terminal of said second mosfet,
   whereby said second capacitor serves to reduce the drain to source voltage of said second mosfet when said composite switch is in an off condition.

3. The composite switch of claim 1 further comprising
   a first diode having an anode terminal and a cathode terminal with said anode terminal of said first diode connected to said source terminal of said second mosfet and with said cathode terminal of said first diode connected to said drain terminal of said first mosfet,
   whereby said first diode provides a mechanism to prevent the conduction of current through the series connection of the body drain diodes of said first and said second mosfets.

4. The composite switch of claim 1 further comprising,
   switch means connected in series with said first capacitor,
   whereby said switch means provides a speed up mechanism for the turn on and turn off transition times of said first mosfet.

5. The composite switch of claim 4 further comprising
   latching means for said switch means to prevent negative feedback from effecting the action of said switch means.

6. The composite switch of claim 1 further comprising
   a third mosfet having a drain terminal, a gate terminal, and a source terminal with said drain terminal of said third mosfet connected to said first composite switch terminal, with said source terminal of said third mosfet connected to said drain terminal of said first mosfet, and with said gate terminal connected to said gate terminal of said first mosfet.

* * * * *